(12) United States Patent
Shao et al.

(10) Patent No.: US 6,657,302 B1
(45) Date of Patent: Dec. 2, 2003

(54) INTEGRATION OF LOW DIELECTRIC MATERIAL IN SEMICONDUCTOR CIRCUIT STRUCTURES

(75) Inventors: Huili Shao, Orlando, FL (US); Susan Clay Vitkavage, Orlando, FL (US); Allen Yen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/464,811

(22) Filed: Dec. 17, 1999

Related U.S. Application Data

(60) Provisional application No. 60/115,604, filed on Jan. 12, 1999.

(51) Int. Cl.[7] ............................................. H01L 23/48
(52) U.S. Cl. ...................... 257/758; 438/106; 438/622
(58) Field of Search ............................... 257/758, 759; 438/106, 622

(56) References Cited

U.S. PATENT DOCUMENTS

| | | | | |
|---|---|---|---|---|
| 5,548,159 A | * | 8/1996 | Jeng ............................ | 257/634 |
| 5,744,865 A | * | 4/1998 | Jeng et al. ................... | 257/750 |
| 5,783,864 A | * | 7/1998 | Dawson et al. .............. | 257/758 |
| 5,818,111 A | * | 10/1998 | Jeng et al. .................. | 257/776 |
| 5,858,871 A | * | 1/1999 | Jeng ............................ | 438/623 |
| 5,976,984 A | * | 11/1999 | Chen et al. .................. | 438/700 |
| 6,054,769 A | * | 4/2000 | Jeng ............................ | 257/758 |

* cited by examiner

*Primary Examiner*—Kamand Cuneo
*Assistant Examiner*—Lourdes Cruz
(74) *Attorney, Agent, or Firm*—Ferdinand M. Romano

(57) ABSTRACT

A structure and method for fabricating integrated circuits with improved electrical performance.

The structure comprises electronic devices formed along a semiconductor surface, a first upper level of interconnect members over the semiconductor surface, a lower level of interconnect members formed between the semiconductor surface and the first upper level, and insulative material positioned to electrically isolate portions of the upper level of interconnect members from one another. The insulative material comprises a continuous layer extending from within regions between members of the upper interconnect level to within regions between members of the lower interconnect level and is characterized by a dielectric constant less than 3.9.

The method begins with a semiconductor layer having electronic device regions thereon. A first insulative layer is deposited over the electronic device regions and a lower level of interconnect members is formed over the first insulative layer. A second insulative layer is formed between and over lower level interconnect members and an upper level of interconnect members is formed over the second insulative layer. Portions of the second insulative layer positioned between interconnect members of the lower and upper levels are removed and a third insulative layer is formed in regions from which the second insulative layer is removed.

33 Claims, 12 Drawing Sheets

INTEGRATION OF LOW DIELECTRIC MATERIAL IN SEMICONDUCTOR CIRCUIT STRUCTURES

This is a conversion of provisional application Ser. No. 60/115,604 filed Jan. 12, 1999.

FIELD OF THE INVENTION

The present invention relates to provision of low RC time constant characteristics in semiconductor interconnection schemes. More specifically, the invention relates to integrated circuit designs and methods of applying insulative materials having low dielectric constants in order to reduce capacitance between conductive lines in such circuit designs.

BACKGROUND OF THE INVENTION

As semiconductor process integration progresses the density of multilevel interconnection schemes continues to increase. At the same time the aggregate amount of interconnect on microprocessors and other complex integrated circuits continues to escalate. In fact, semiconductor interconnect requirements are considered one of the most demanding aspects of ultra large scale integration efforts. Among other concerns, it is becoming more difficult to sustain acceptable electrical performance as devices of growing complexity are manufactured at smaller geometries. Specifically, the speed of signals propagating on interconnect circuitry vary inversely with line resistance and capacitance.

With feature sizes and spacings becoming smaller, the speed of an integrated circuit depends less on the switching device characteristics and depends more on the electrical properties of the interconnect structure. Conductors providing lower resistivity are desired in order to increase current density and insulators having lower dielectric constants are needed to reduce capacitance. Thus there is some motivation to not use Al interconnect and silicon dioxide insulator. (Silicon dioxide deposited by chemical vapor deposition has a dielectric constant of 4.0 or higher, depending on moisture content.) It is becoming necessary to apply new materials, e.g., metals having better conductive properties and insulators having lower dielectric constants, in order to maintain and improve electrical performance characteristics. In particular, efforts to reduce RC time delays and capacitive coupling have resulted in greater use of silicides and copper metalization schemes as well as the so called "low k" dielectrics, the latter being insulative materials characterized by relatively low dielectric constants relative to silicon dioxide. Nonetheless, RC delay and capacitive coupling are recognized as significant limiting factors affecting high frequency circuit performance.

With regard to low k dielectrics, as geometries have extended below the 0.25 micron regime and move toward 0.1 micron, the thermal and mechanical properties of these materials are of limited compatibility with current manufacturing processes. For example, due to desired porosity which helps decrease the dielectric constant, the mechanical properties are not well-suited for chemical-mechanical polishing (CMP). That is, the dielectric material, which is typically spun-on (in the case of polymers) or deposited (if inorganic), is relatively soft or flaky such that there is insufficient control during the polish step. Known accommodations include depositing more rugged cap dielectrics over the low k material in order to utilize established process equipment. For example, hydrogen silsesquioxane (k=3, approx.), a strong candidate for replacing silicon dioxide, has high thermal stability, excellent gap-fill properties, and low current leakage. Nonetheless, because the material is not suitable for standard CMP, volume manufacture has required that an overcoat of silicon dioxide formed by Plasma Enhanced Chemical Vapor Deposition (PECVD) be applied prior to the CMP operation and polishing is limited to this cap layer. Use of cap material permits CMP processing but this is considered sub-optimal for high performance circuitry. The cap oxide, having a significantly higher dielectric constant, can influence some electrical circuit properties. Elimination of cap oxide will provide improved circuit performance.

More generally, efforts continue to apply insulators having even lower dielectric constants (approaching k=1.5). The two most important properties for successful implementation of such materials in processes below 0.2 micron are considered to be adhesion (to dissimilar materials) and mechanical toughness (for CMP). Certain forms of hydrogen silsesquioxane can exhibit dielectric constants of approximately 1.5 by controlling the void volume. They also exhibit relatively good adhesion to other materials such as metal bond pads and differing dielectric materials. Of course these favorable results may depend largely on optimized process conditions, e.g., the satisfactory cleaning of surfaces prior to formation of the dielectric thereon, but they appear attainable. In contrast to the advancements made in performance and materials compatibility, manufacturable solutions which accommodate the mechanical properties of low k dielectrics have been generally limited to provision of oxide cap polishing layers. A different approach, which does not require polishing of the low k dielectric material nor the provision of a relatively hard cap layer thereon, will simplify manufacture of multi-level interconnect schemes.

SUMMARY OF THE INVENTION

According to one aspect of the invention, a solution to the aforementioned problems begins with provision of an insulator material between interconnect members, followed by replacement of the insulator material with a dielectric material having a lower dielectric constant.

Generally, the invention enables relatively simple and cost efficient placement of insulative material having a low dielectric constant between interconnect members of a circuit structure. According to the invention, the structure is etched to remove oxide between or above conductive members. Utilization of an anisotropic etch assures that portions of the oxide are left in place, aligned with interconnect members.

A circuit structure fabricated accordingly has a first level of interconnect members formed over a semiconductor layer and a lower level of interconnect members formed between the semiconductor layer and the first level of interconnect members. An insulative material such as silicon dioxide electrically isolates interconnect members of the lower level from devices formed along the semiconductor surface while a different insulative material, e.g., a low k dielectric such as hydrogen silsesquioxane, electrically isolates interconnect members of the first level from one another.

The foregoing background and summary have outlined general features of the invention. Those skilled in the art may acquire a better understanding of the invention and the preferred embodiments with reference to the drawings and detailed description which follow.

BRIEF DESCRIPTION OF THE DRAWINGS

A more complete understanding of the invention will be acquired from the detailed description which follows, when read in conjunction with the accompanying drawings in which.

Like numbers denote like elements throughout the figures and text. Features presented in the drawings are not to scale.

DETAILED DESCRIPTION

Figure 1A:
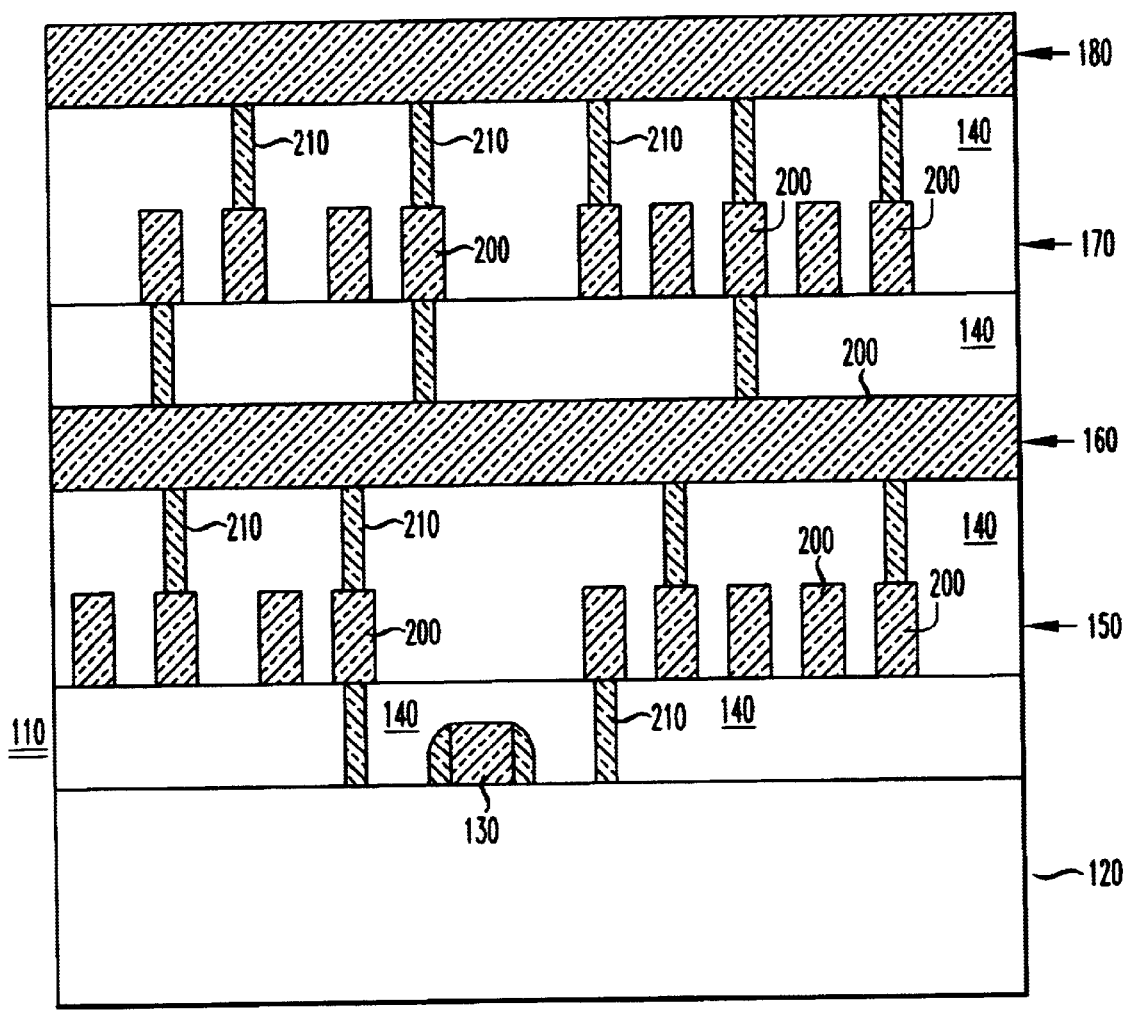
FIGS. 1a and 1b illustrate in cross section a portion of a semiconductor circuit structure an intermediate phase of fabrication.
Figure 1B:
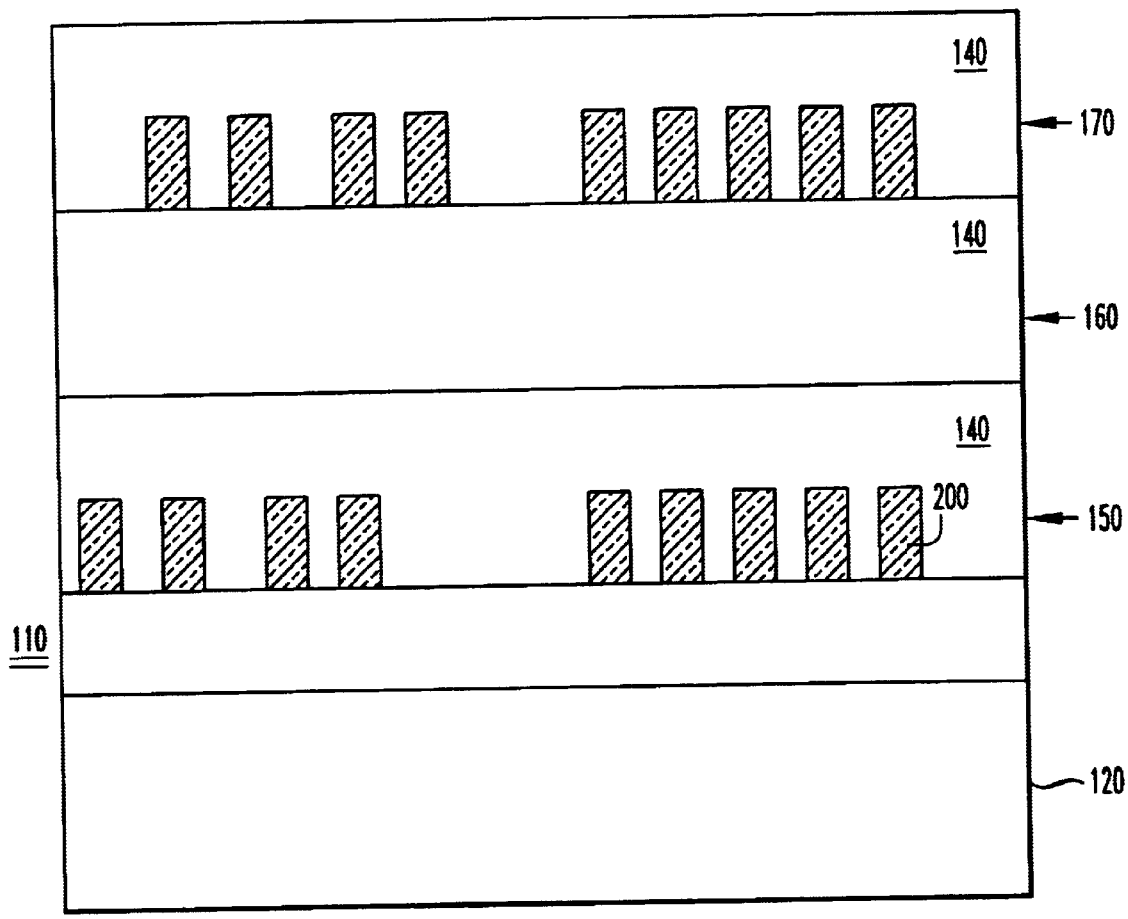

Referring initially to FIGS. 1a and 1b, there is illustrated in partial cross sectional views a conventionally formed semiconductor circuit structure 110 at an intermediate phase of fabrication. Generally the figure illustrates partial formation of a multilevel interconnect structure over a semiconductor surface 120 for connection with an exemplary semiconductor device 130 formed thereon. The invention is particularly useful for complex CMOS structures as depicted herein, but is not at all limited to MOS devices or even silicon structures. Bipolar, BICMOS and compound semiconductor structures with multiple levels of circuit interconnect could incorporate the same concepts. Similarly the interconnect structure is not limited to specific types of materials. Al and Cu alloys are preferred over silicides, although combinations of these and other materials may provide suitable levels of conductance for specific circuit applications.

The view of FIG. 1a is taken along a first plane orthogonal to the semiconductor surface 120 in order to illustrate multiple levels of interconnect sequentially formed in alternating directions. FIG. 1b provides a different partial cross sectional view of the same structure 110, taken along a second plane orthogonal to the semiconductor surface 120 and parallel to the first plane. With respect to FIGS. 1a and 1b, there are shown a plurality of dielectric layers 140 providing isolation for a plurality of devices 130 (one of such devices visible in the partial views), a lower interconnect level 150, several intermediate interconnect levels 160, 170 and an upper interconnect level 180. Each interconnect level comprises a plurality of individual conductor members 200 commonly formed of an Al alloy (e.g., 0.5% Cu). The dielectric layers 140 are, as is common, a multilayer silicon dioxide deposit (k=3.9 approx.) comprising, for example, HDP oxide (silicon dioxide formed by high density plasma deposition) underlying a lower density oxide formed from TEOS (decomposition of tetraethyl orthosilicate). All of the aforementioned interconnect levels are global. Although not described in the figures, the structure could incorporate local interconnect conductor in addition to, or in lieu of, level 150.

Figure 2:
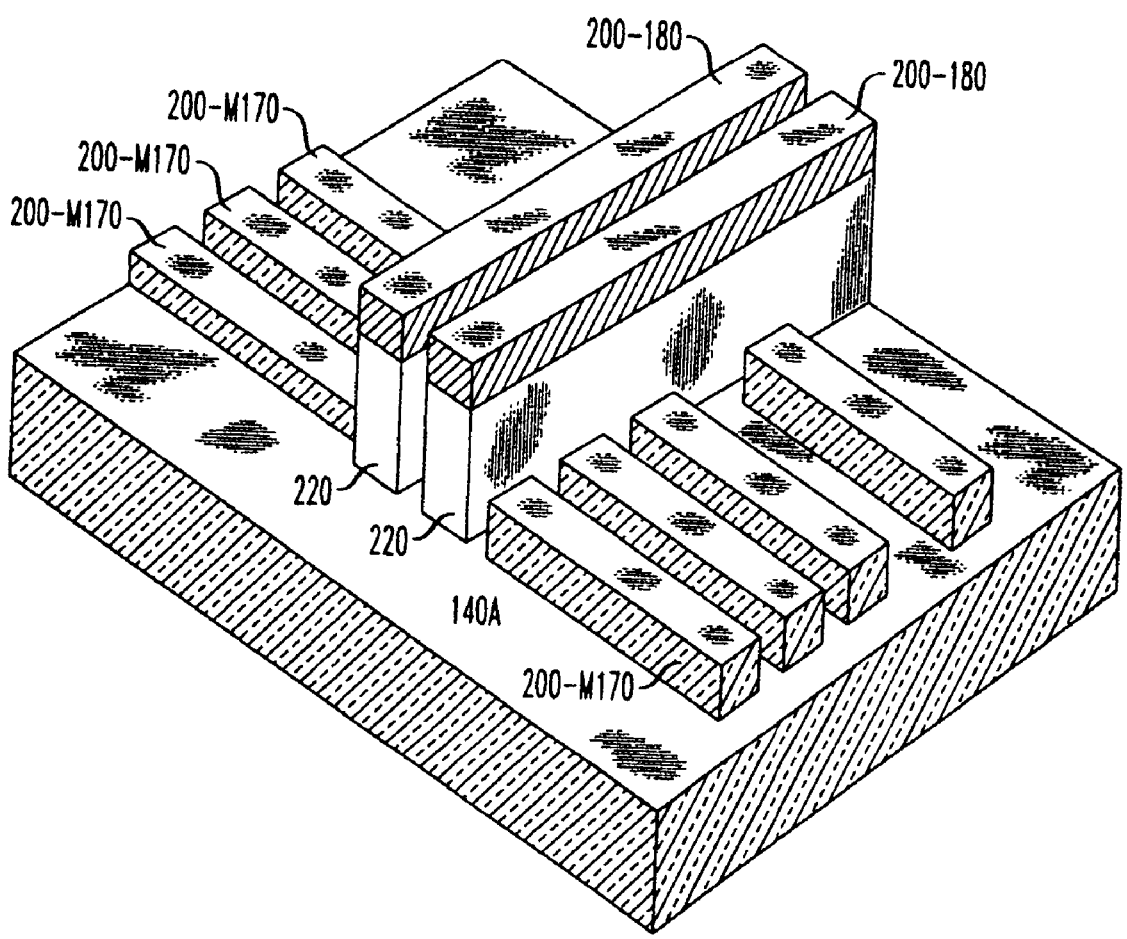
FIG. 2 provides a partial perspective cut-away view of the FIG. 1 circuit structure during a subsequent phase of fabrication according to the invention.

In this example structure the members 200 of each interconnect level are parallel to one another, and the parallel members of each interconnect level are orthogonal with respect to members in both the previously-formed and the next-formed ones of the sequentially formed levels of interconnect. The first and second planes (of FIGS. 1a and 1b, respectively) pass through interconnect levels 150 and 170 to provide a view in cross section of several individual members 200 associated with each of these two levels. The first plane, along which only the view of FIG. 1 is taken, also passes through an individual member 200 of interconnect level 160 as well as through an individual member 200 of interconnect level 180. The second plane, along which the view of FIG. 2 is taken, passes between two members 200 of interconnect level 160 as well as between two members 200 of interconnect level 180.

The various levels of interconnect and the device 130 are connected through the oxide interlevel dielectric layers 140 with conventional metal-to-metal contacts. With the members 200 comprising Al alloy, W contacts 210 are each conventionally formed in etched vias to connect portions of the device 130 with individual members 200. Specifically, contacts 210 are formed in vias by first depositing a first Ti barrier layer, approximately 60 nm (at 400 C.), followed by depositing approximately 750 A of TiN (also at 400 C.) and then annealing. Approximately 400 nm of W is then deposited (at 425 C.) and the structure is polished.

After defining each level of W contacts 210 the overlying interconnect level is formed, generally by a 400 C. sequential sputter to form a Ti/TiN stack (37 nm of Ti, 60 nm of TiN), followed by depositing 400 to 700 nm of Al/Cu alloy and 25 nm of TiN. Interconnect members 200 are then patterned and etched in each of the interconnect levels. Over each of the interconnect levels 150, 160 and 170, the silicon dioxide dielectric layers 140 are deposited (HDP followed by TEOS) followed by a metal topographic reduction (e.g., flow of planarization resist and etchback) to prepare the surface for the next cycle of contact formation.

According to the invention, no deposition of silicon dioxide is needed to fill spaces between conductive members of interconnect level 180 or to cover interconnect level 180. Instead, the structure 110, having exposed members 200 of interconnect level 180, is etched to remove portions of the silicon dioxide layer 140 residing between interconnect levels 170 and 180 as well as portions between the conductive members 200 of interconnect level 170. The resulting structure is illustrated in the partial perspective cut-away view of FIG. 2, wherein conductive members of interconnect level 170 are denoted by reference numeral 200-M170; and conductive members of interconnect level 180 are denoted by reference numeral 200-M180. The oxide layer 140 extending from interconnect level 160 up to interconnect level 170 (denoted by reference numeral 140a in FIG. 2) is left exposed by the etch process. Preferably this oxide removal is effected with an anisotropic reactive ion etch, leaving oxide elements 220 of silicon dioxide between members 200-170 of interconnect level 170 and members 200-180 of interconnect level 180. Although not shown in the figures, the etch step could further remove portions of layer 140a to eliminate effects of having a relatively high k dielectric in fringe regions adjacent conductive members 200.

Due to the anisotropic nature of the etchant, the residual elements 220 are self-aligned with overlying members 200-180. At this step of the process it is believed that the dielectric oxide elements 220 serve as support structures adding rigidity to the conductive members 200-180. This is important to sustain the integrity of the exposed members 200 as well as the spatial relationships between members on the same and different levels of interconnect. However, the spacings of W contacts 210 and the relative dimensions of the members 200-180 may assure sufficient stability between exposed members 200 as to render the oxide elements 220 unnecessary. To preserve the conductor members 200, the preferred etch chemistry is highly selective, e.g., 30:1 ratio, with respect to the Al/Cu composition of the members. The following chemistry and conditions are exemplary:

| Tool Power (watts) | |
| --- | --- |
| Top power | 500–1500 |
| Bias Power | 1000–2000 |
| Gas Flow (sccm) | |
| Argon | 20–150 |
| Oxygen | 4–10 |
| C4F8 | 4–10 |
| CO | 0–20 |
| Nitrogen | 20–60 |
| Pressure (mT) | 28 |

After a solvent clean, e.g., Aleg 310, a low k dielectric is applied. The low k dielectric should have suitable fill properties for the geometries involved. For design rules with minimum interconnect spacings of 0.32 micron preferred choices include: (a) spin-on-glasses such as hydrogen silsesquioxane (HSQ, k ranging from approx. 2.7 to 3.5) (Flowable Oxide), methyl silsesquioxane (MSSQ) (available from Allied Signal) and organo silsesquioxane (k ranging from approx. 2.7 to 3.5) (Acuspin); (b) CVD Polymers including Parylene N (k approx. 2.6), Teflon CVD fluorocarbons (k=1.93) and thermal CVD fluorocarbons (k approx. 1.9); (c) spin-on polymers such as polyamides (k ranging from approx. 2.7 to 2.9) and fluorinated polyamides (k ranging from approx. 2.3 to 2.5); (d) plasma polymers including fluorinated amorphous carbon (k=2.1) and fluorinated hydrocarbon (k ranging from 2.0 to 2.4); and (e) nanofoam polymers/aerogels such as porous polyamides (k approx. 2) and nanoporous Silica Aerogel (k≦2). Of the foregoing, HSQ and MMSQ are known to have desirable gap fill properties. For Damascene Cu processes discussed below choices include benzocyclotene, Paralyne-N and Polyimide.

By way of example, HSQ may be applied to the exposed surface of oxide layer 140a and completely around the exposed surfaces of oxide elements 220 to cover the conductive members 200-170 and 200-180. The structure is then baked at 300 C. to 400 C. for 30 minutes followed by a 30 minute cure in a nitrogen atmosphere (e.g., 400 C.).

Figure 3:
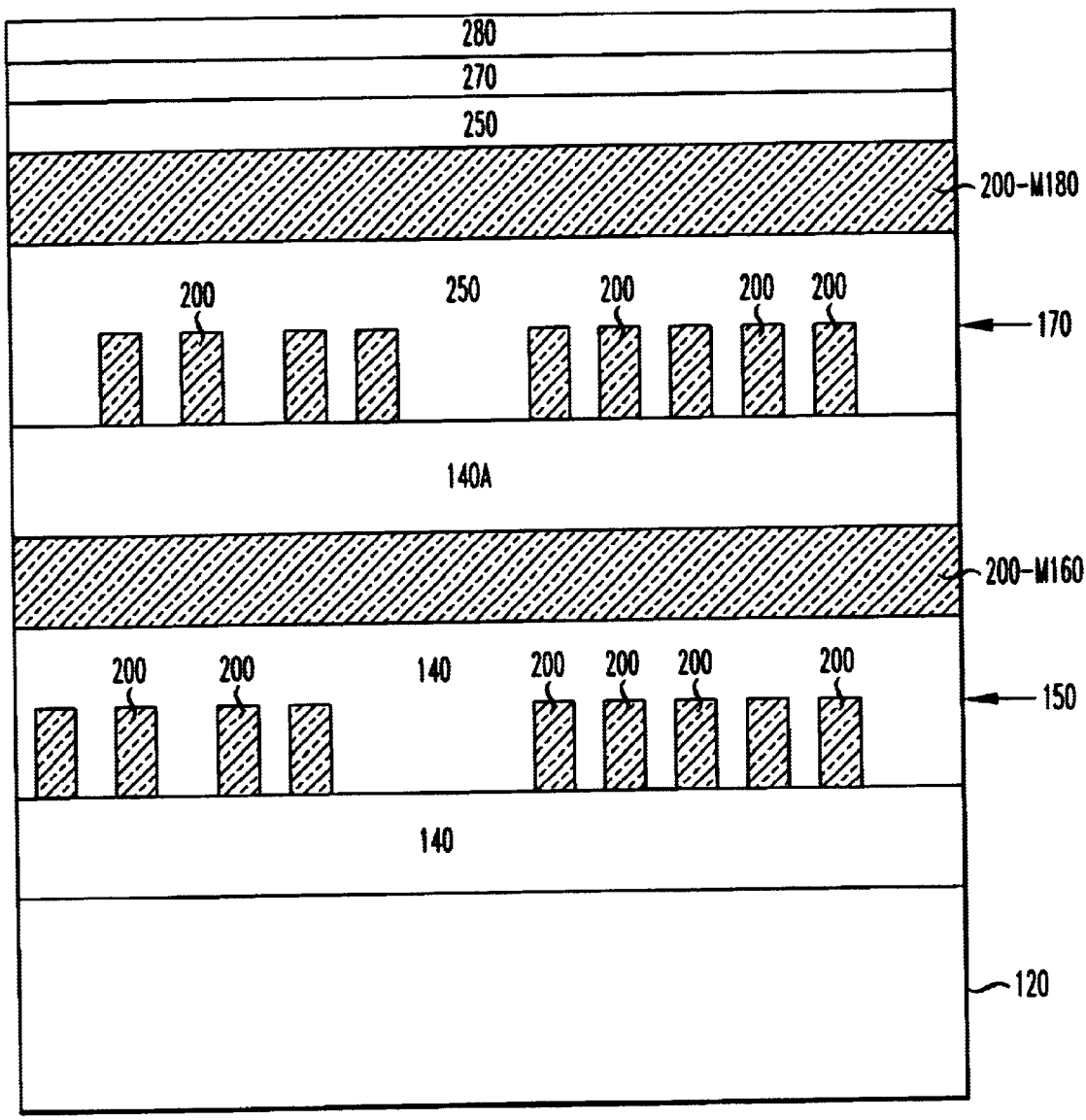
FIG. 3 depicts the circuit structure of FIG. 2 after further processing.

FIG. 3 illustrates the resulting circuit structure 110 in partial cross sectional view along the same plane as the view of FIG. 1b. A conductive member 200 of each interconnect level 160 and 180, although not residing in the plane, is illustrated with phantom lines in FIG. 3. A low k dielectric layer 250 fills the previously etched voids, extending from the oxide layer 140a to between the conductive members 200 of interconnect level 180 and generally overlying the level 180. A silicon dioxide layer 270 is formed over the layer 250 and a silicon nitride cap layer 280 is deposited over this. Standard bond pad formation follows.

For this and other embodiments of the invention, it should be noted that the etch can be performed over select areas of the wafer being processed, e.g., areas of the integrated circuit having high density interconnect structure, while masking other portions of the wafer, e.g., with photo resist.

This provides flexibility to draw upon the superior strength or thermal conductivity properties of silicon dioxide in regions where these characteristics are desired or where is of lesser importance to provide low k dielectric material.

Figure 4A:
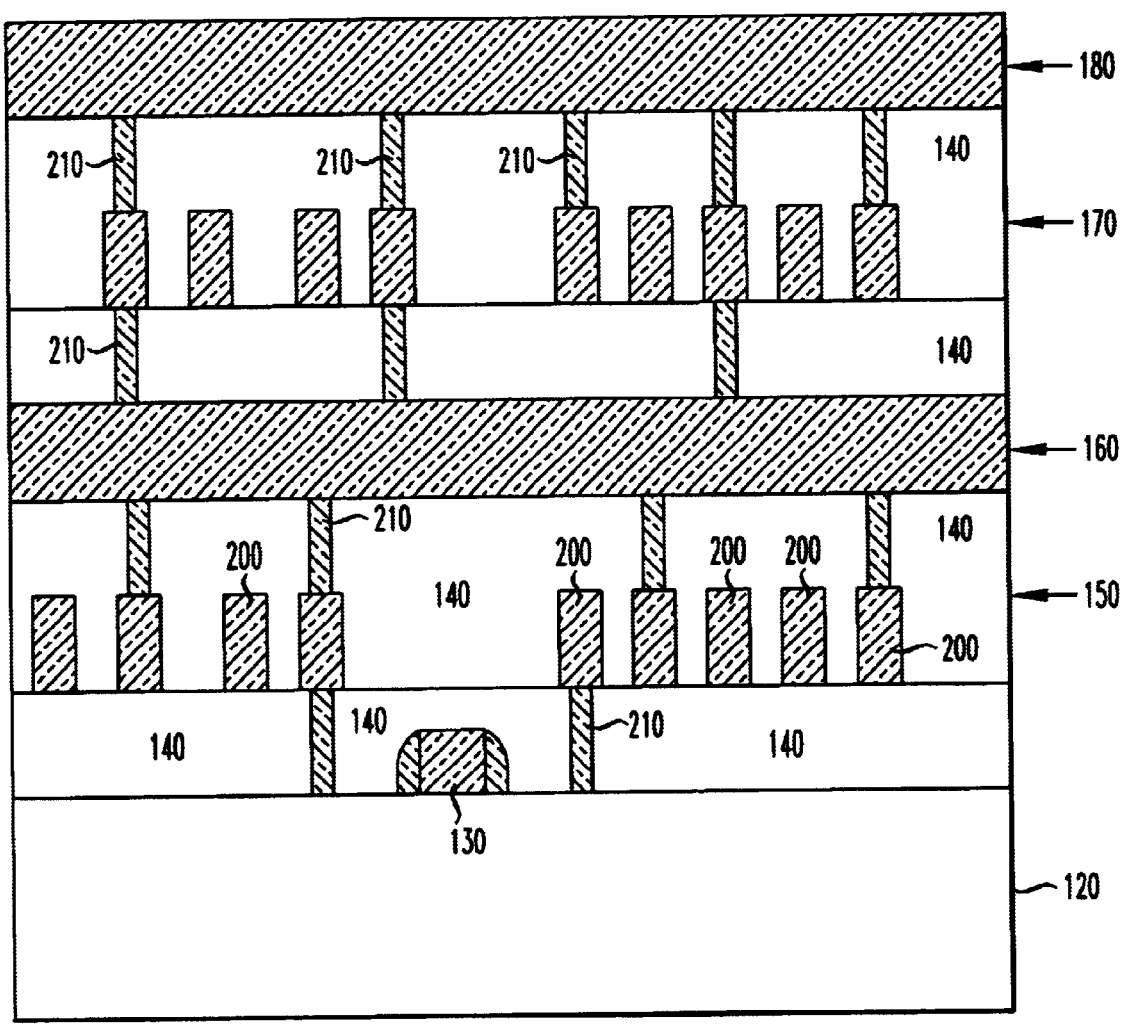
FIGS. 4a and 4b depict another portion of the circuit structure of FIG. 1 after processing according to a second embodiment of the invention.

The concepts disclosed with reference to FIGS. 1, 2 and 3 apply to more than two levels in a multilevel interconnect structure, e.g., removal of two or more levels of adjoining oxide layers 140 (see again FIG. 1a) followed by application of low k dielectric material into all levels of exposed interconnect structure. According to a second embodiment of the invention FIGS. 4a and 4b again illustrate in partial cross sectional view the circuit structure 110 at an intermediate phase of fabrication. The view of FIG. 4a is taken along the same plane as the view of FIG. 1a but along a different portion of the circuit structure 110 where members 200 of interconnect level 170 are aligned over members 200 of interconnect level 150 resulting in aligned pairs of members 200.

Figure 4B:
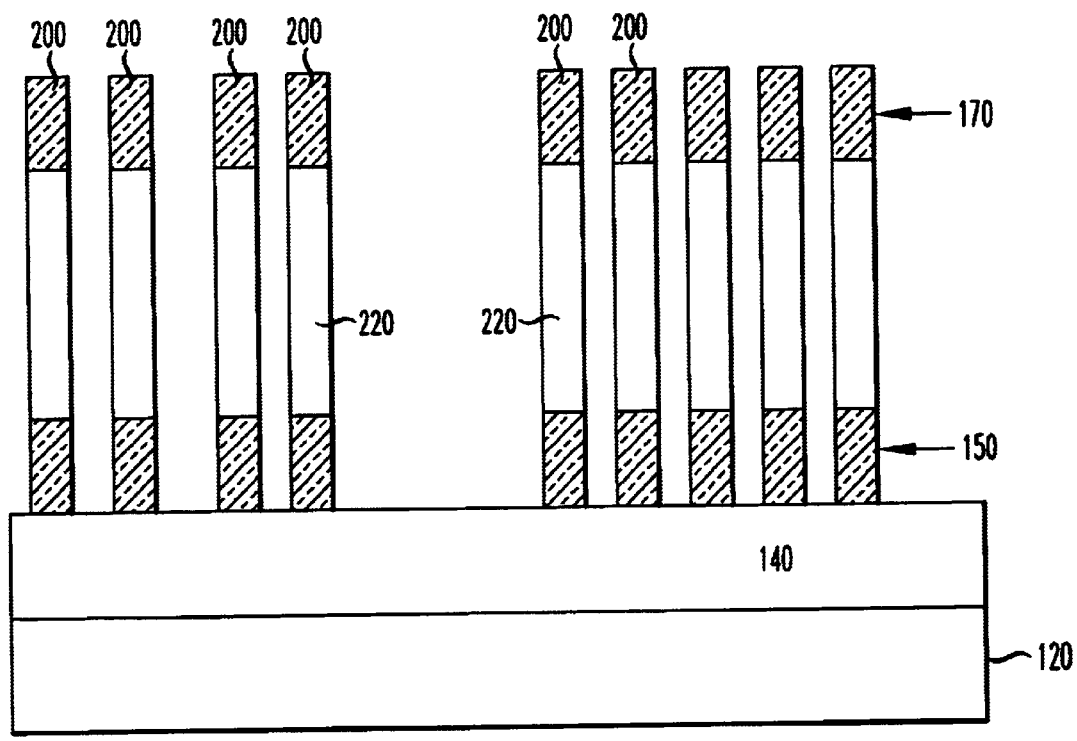

The view of FIG. 4b, taken along the same plane as the view of FIG. 1b, further illustrates the aligned pairs of members 200 from levels 150 and 170. Portions of silicon dioxide layers 140 have been anisotropically etched from the upper interconnect level 180 through the intermediate interconnect levels 170 and 160 and at least through the lower interconnect level 150. Residual oxide elements 220 are self-aligned with overlying members 200. The resulting voids are filled with a low k dielectric layer.

Figure 5A:
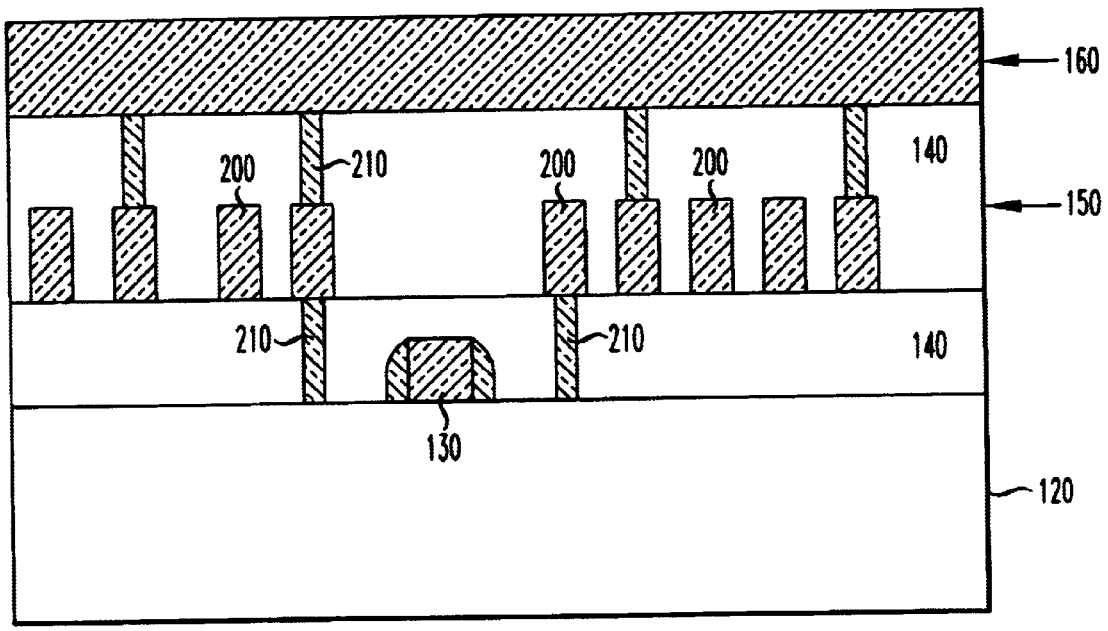
FIGS. 5a and 5b illustrate a partially formed circuit structure for practicing the invention according to a third alternate embodiment.
Figure 5B:
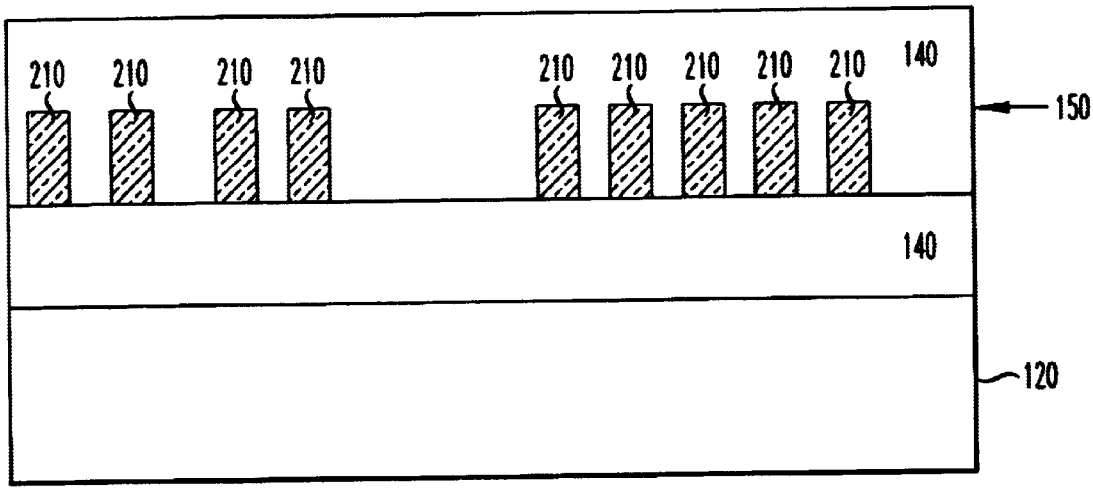

Due to gap-fill limitations of some low k dielectrics, particularly those having a k value less than 2.5, it may be more desirable to sequentially form low k layers as groups of two or more interconnect levels are formed. According to a third embodiment of the invention such an approach may begin with a partially formed circuit structure 400 illustrated in FIGS. 5a, 5b wherein the same reference numerals used in preceding figures are used to denote similar features. Circuit structure 400 as so far illustrated in FIG. 5 has two levels of interconnect 160 and 170 but is otherwise similar to the circuit structure 110 of FIG. 1 at an intermediate phase of fabrication. That is, the view of FIG. 5a is taken along a first plane orthogonal to a semiconductor surface 120 in order to illustrate multiple levels of interconnect sequentially formed in alternating directions. The partial cross sectional view of FIG. 5b is taken along a second plane orthogonal to the semiconductor surface 120, parallel to the first plane, and between two members 200 of interconnect level 160.

With deposited silicon dioxide layers 140, contacts 210 formed therein provide connection between a device 130, lower interconnect level 150 and an intermediate interconnect level 160. Notably, and analogous to the non-filled regions between members 200 of interconnect level 180 in FIGS. 1 and 2, no silicon dioxide overlies interconnect level 160 or fills spaces between members 200 of the interconnect level 160. At this point in the fabrication process an anisotropic etch is applied to remove portions of the silicon dioxide layer 140 between interconnect levels 150 and 160 as well as through portions between the conductive members 200 of interconnect level 150. The etch may continue below the interconnect level 150 as well to eliminate effects of having a relatively high k dielectric in fringe regions adjacent conductive members 200.

Figure 6A:
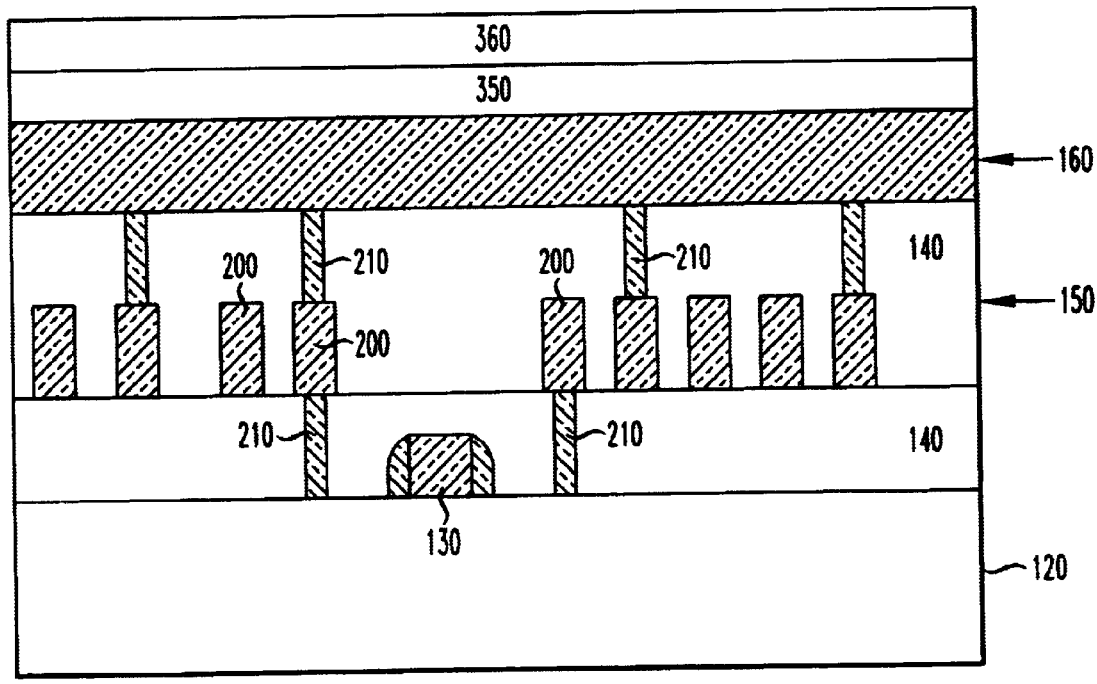
FIGS. 6a and 6b illustrate the structure of FIG. 5 at a subsequent stage of processing.
Figure 6B:
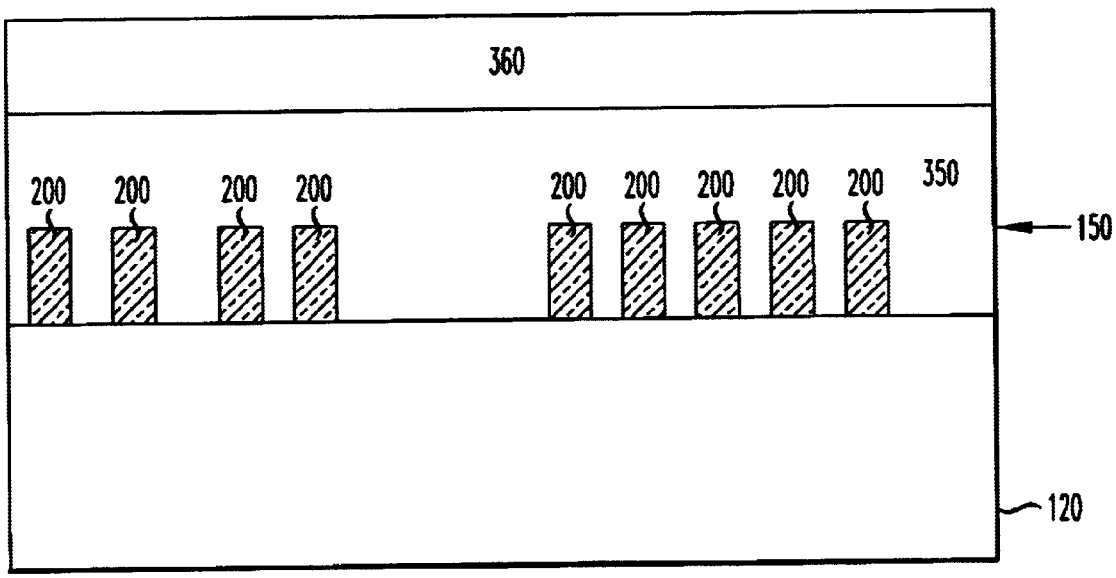
Figure 7A:
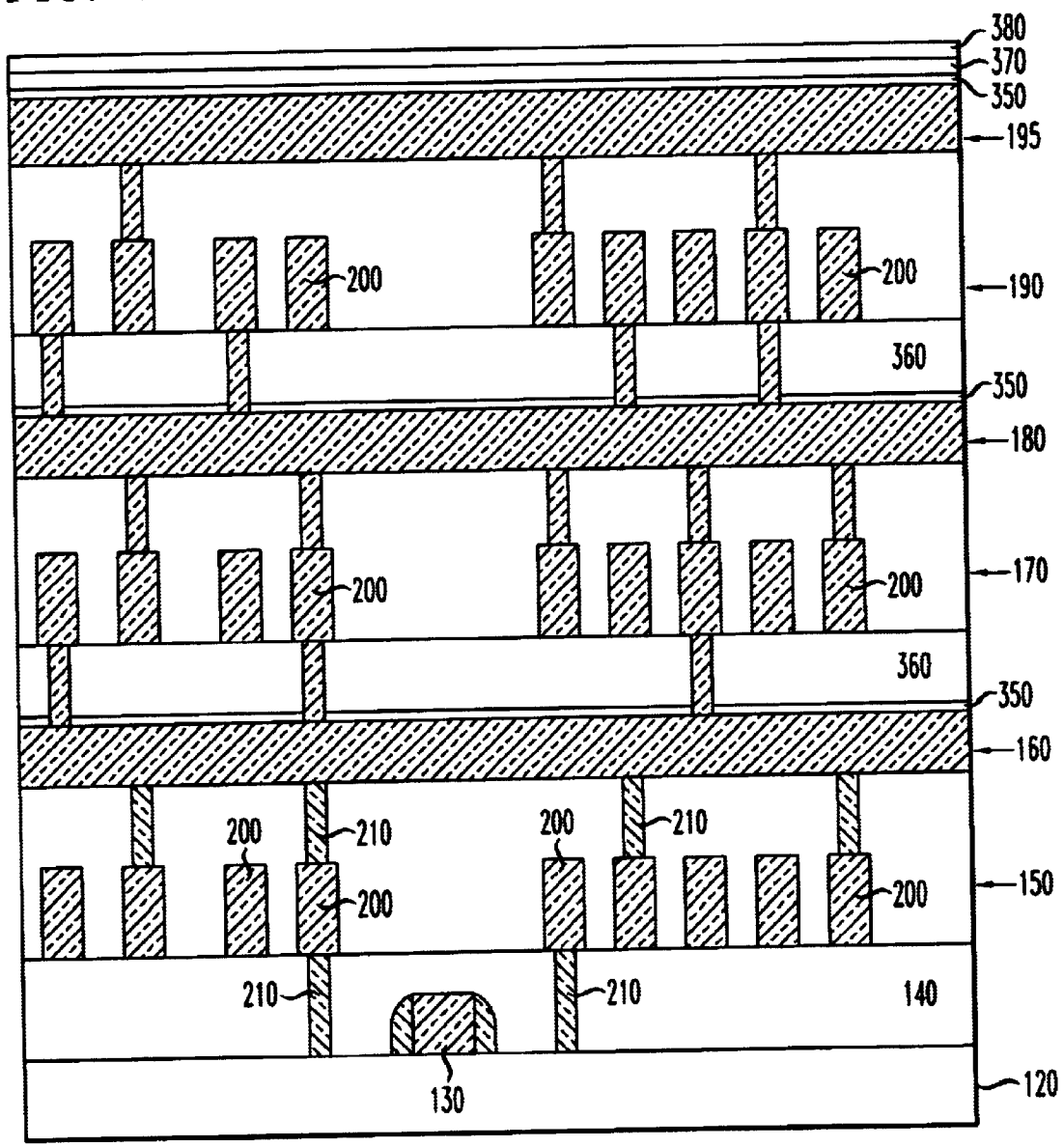
FIGS. 7a and 7b further illustrate the third embodiment of the invention.
Figure 7B:
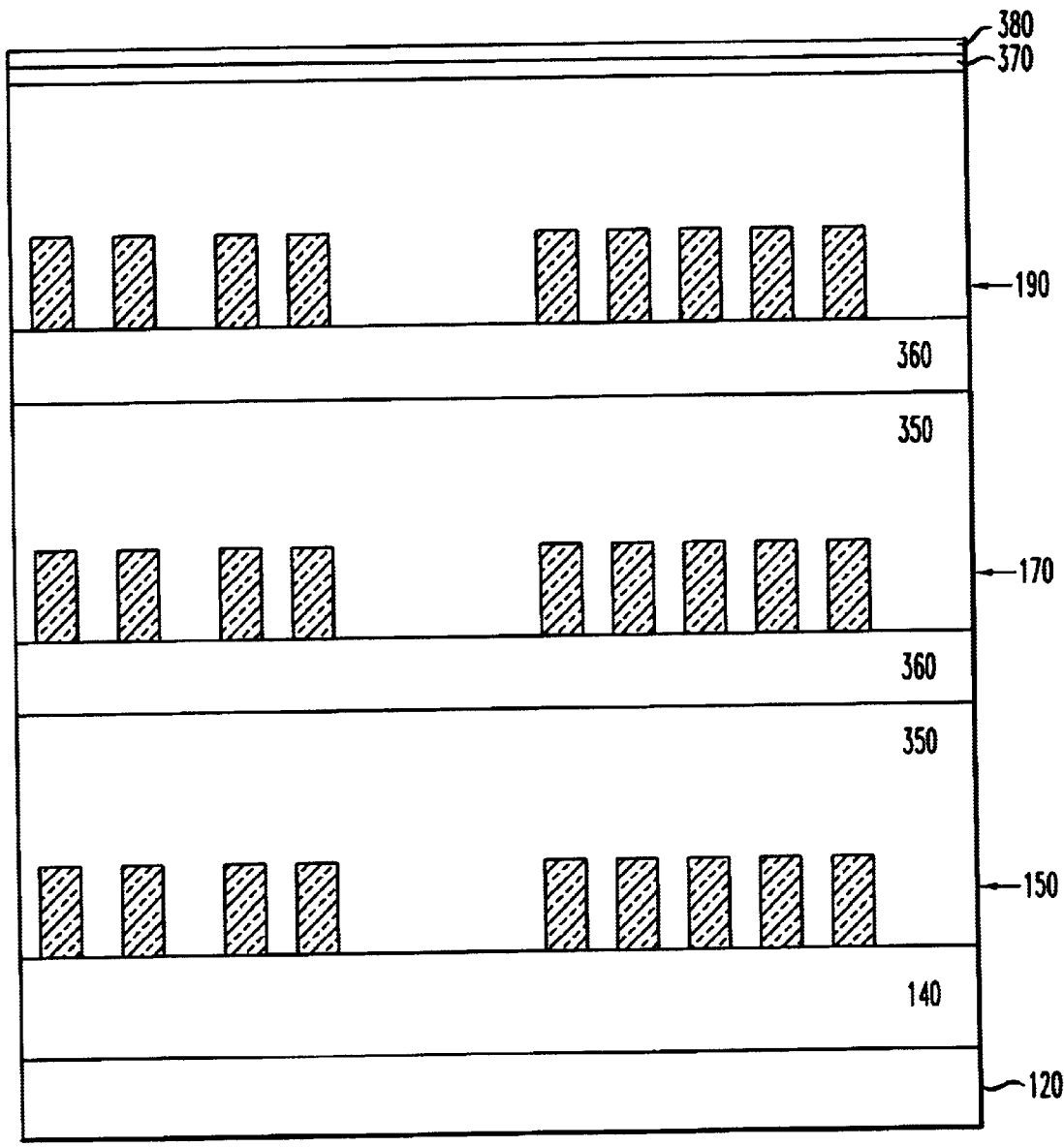

Next a HSQ low k dielectric layer 350 is spun on or deposited, then baked at 350 C. for 30 minutes followed by a 400 C. cure for 30 minutes in a nitrogen atmosphere. Preferably the HSQ deposition is of sufficient thickness to provide a minimum thickness layer over the interconnect level 160 of several hundred nm to assure provision of low k dielectric in fringe regions above conductive members 200 where fields contributing to capacitance may be prevalent. At this point up to 600 nm of TEOS is applied by PECVD over the low k layer 350, followed by CMP. FIG. 6a (view taken along same plane as FIG. 5a) and FIG. 6b (view taken along same plane as FIG. 5b) illustrate the resulting structure with a polished oxide cap layer 360 of sufficient thickness to begin formation of additional interconnect levels and connecting contacts. FIGS. 7a and 7b (views again taken along same planes as FIGS. 5a and 5b) illustrate a subsequent stage of processing with such additional interconnect levels 170a, 180a, 190a and 195a and the intermittent inclusion of additional cap layers 360 each formed in the manner already described with reference to FIG. 4. Each oxide cap layer 360 may be thinned to maximize the volume occupied by the low k dielectric layer 350.

Still referring to FIGS. 7a and 7b, a final application of HSQ over interconnect levels 190a and 195a provides the last layer 350 of low k dielectric. A silicon dioxide layer 370 and then a silicon nitride cap layer 380 are deposited over the low k layer 350 as shown in FIGS. 7a and 7b such that standard bond pad formation may follow. Bond pad formation (not illustrated) may be had in a masked-patterned region such that the bond pads are formed on silicon dioxide to assure mechanical strength of the underlying dielectric. This illustrated portion of the resulting circuit structure has low k dielectric applied to reduce capacitance at and about all interconnect levels.

Figure 8A:
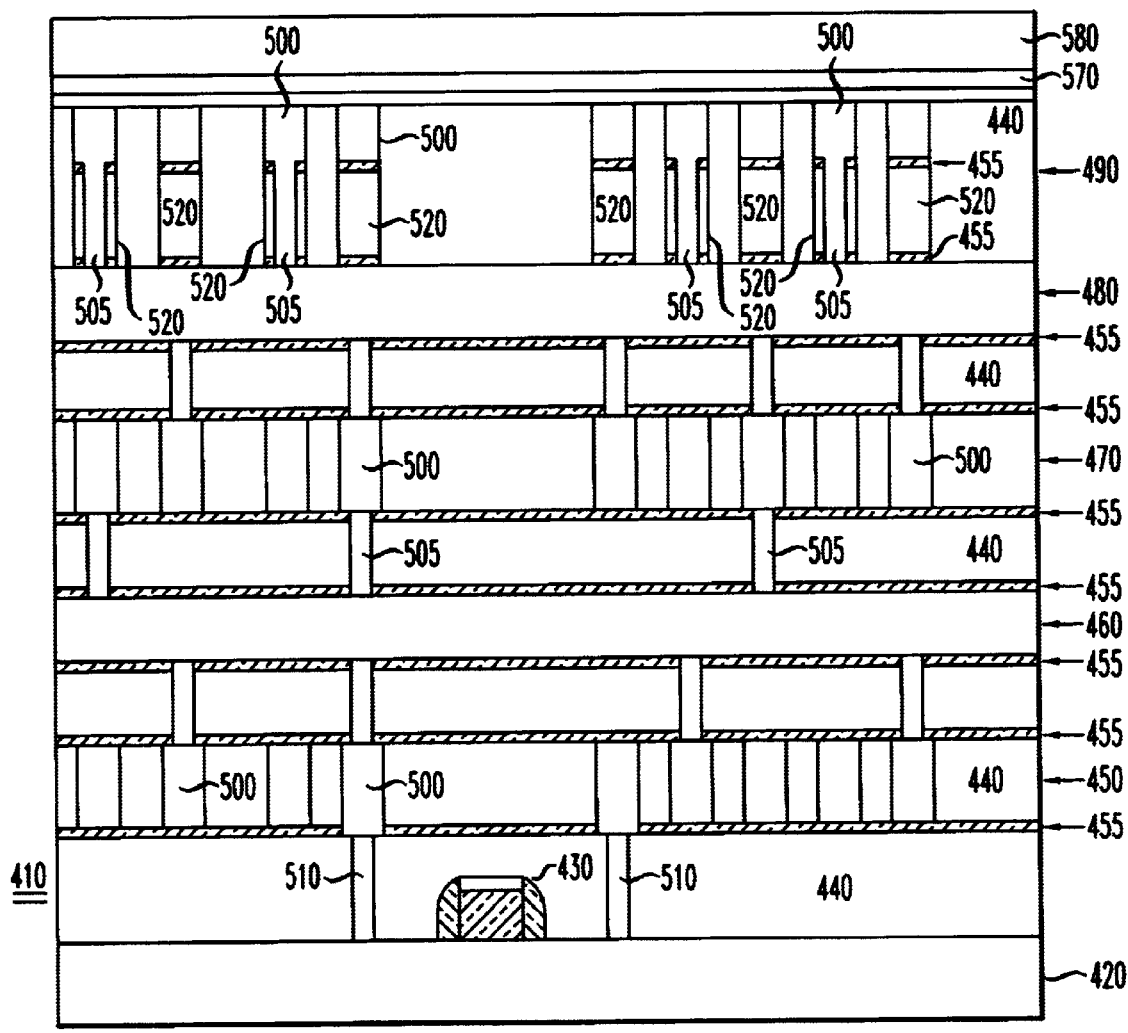
FIGS. 8a and 8b illustrate still another circuit structure according to a fourth embodiment of the invention.
Figure 8B:
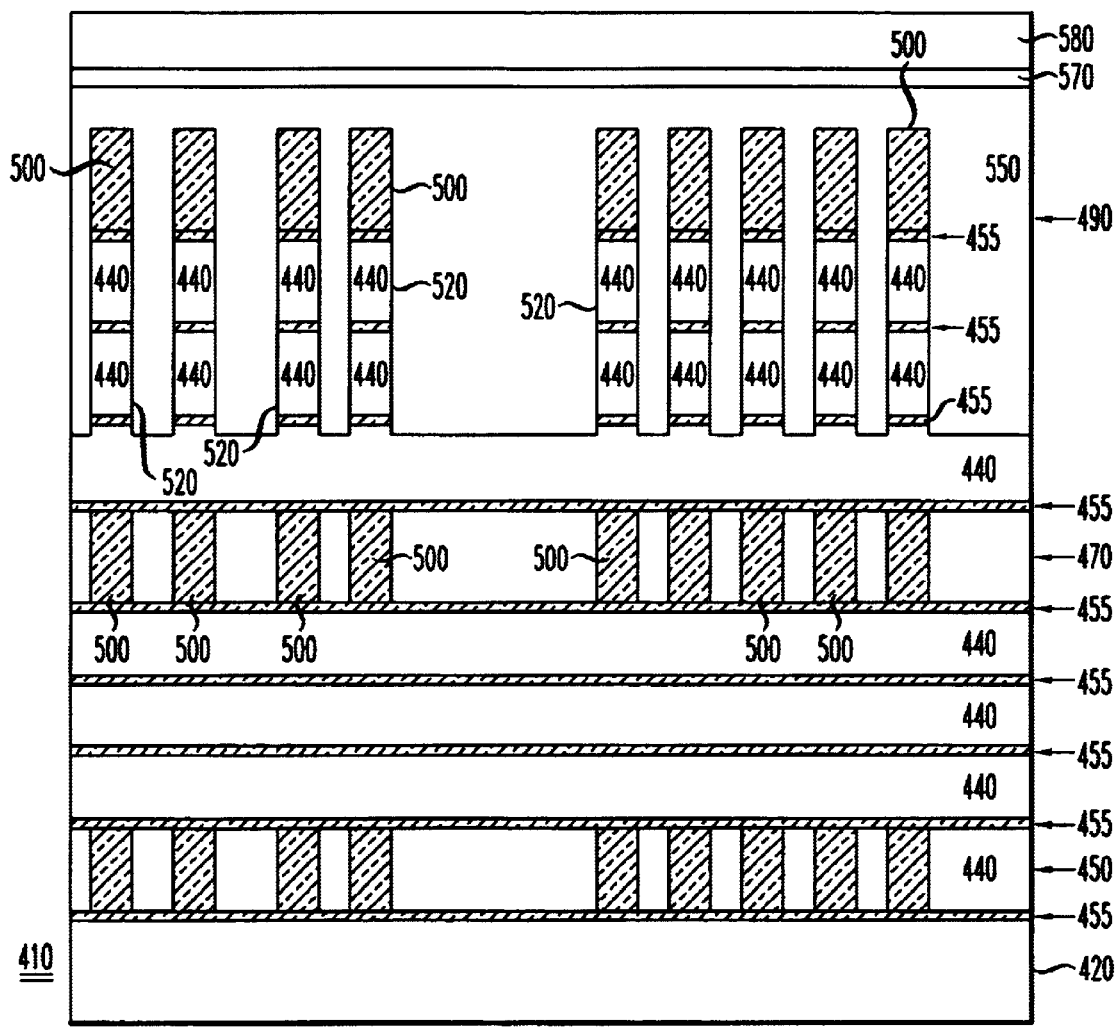

The general concepts so far disclosed are applicable to a wide variety of interconnect systems. For example, the invention can be applied to multi-level dual Damascene interconnect structures. FIGS. 8a and 8b illustrate a circuit structure 410 incorporating the invention according to a fourth embodiment. A multilevel Cu interconnect structure overlies a semiconductor surface 420 for connection with an exemplary semiconductor device 430 formed thereon. The partial cross sectional views of FIGS. 8a and 8b are, respectively, analogous to the views of FIGS. 1a and 1b.

FIG. 8a, taken along a first plane orthogonal to the semiconductor surface 420, illustrates multiple levels of interconnect sequentially formed in alternating directions. FIG. 8b is taken along a second plane parallel to the first plane. In these figures there are shown: a plurality of silicon dioxide interlevel dielectric layers 440 separating a lower Damascene interconnect level 450, several intermediate dual Damascene interconnect levels 460, 470, 480, and an upper dual Damascene interconnect level 490. Each level comprises a plurality of individual conductor members 500 and integrally formed contacts 505 (for connection to an underlying interconnect level) typically formed of electroplated Cu. The dielectric layers 440 formed over the interconnect levels may be TEOS deposited silicon dioxide while the layer 440 adjoining the semiconductor surface 420 may comprise HDP oxide underlying oxide formed from doped TEOS.

In this example structure the members 500 of each interconnect level are parallel to one another, and the parallel members of each interconnect level are orthogonal with respect to members in both the previously-formed and the next-formed ones of the sequentially formed levels of interconnect. The first and second planes pass through interconnect levels 450 and 470 to provide a view in cross section of several individual members 500 associated with each of these two levels. The first plane, along which the view of FIG. 8a is taken, also passes through an individual member 500 of interconnect level 460 as well as through an individual member 500 of interconnect level 480. The second plane, along which the view of FIG. 8b is taken, passes between two members 500 of interconnect level 460 as well as between two members 500 of interconnect level 480.

The various levels of dual Damascene interconnect are connected through the oxide interlevel dielectric layers 440 while the device 430 is connected with conventional metal-to-metal W contacts 510 as described above with reference to contacts 210 for the embodiment shown in FIG. 1.

After defining the contacts 510 the Damascene interconnect level 450 is formed over a silicon nitride layer 455 (about 50 nm), over which there is sequential formation of the dual Damascene interconnect levels 460, 470 and 480, each formed through a stack deposit comprising a silicon nitride layer 455, a silicon dioxide dielectric layer 440 another silicon nitride layer 455 and another silicon dioxide layer 440 in accordance with normal processing for dual Damascene interconnect so that the structure is suitable for a next cycle of dual Damascene contact and interconnect formation. Level 490 is also formed in a stack layer comprising a silicon nitride layer, a silicon dioxide layer 440, another silicon nitride layer 455 and a silicon dioxide layer 440, all deposited over level 480. For simplicity, formation of barrier layers prior to electroplating, e.g., Ta/TaN, to prevent Cu migration is not illustrated.

According to the invention, an etch is performed to reveal the level 490 and regions between level 480 and 490 and regions between the members 500 of level 480.

As described for other embodiments the oxide removal is best effected with an anisotropic reactive ion etch, leaving silicon dioxide/silicon nitride/silicon dioxide stack elements 520 between members 500 of interconnect level 490 and members 500 of interconnect level 480. See FIG. 8b.

The preferred etch chemistry, highly selective with respect to Cu, is essentially the same as described herein for embodiments of the invention incorporating Al interconnect. A low k dielectric material 550 is applied to fill voids about the levels 480 and 490 and to cover the interconnect structure. Subsequently, silicon dioxide layer 570 and nitride layer 580 are deposited. Bond pad formation follows.

Although the described Damascene embodiment only illustrates provision of low k dielectric material about interconnect levels 480 and 490, alternate embodiments analogous to those already described herein for Al interconnect structures are apparent. That is, to provide desired electrical properties low k dielectric material can be applied to multiple levels of a Damascene interconnect structure, e.g., by sequential removal or by etching through multiple levels of silicon dioxide.

The exemplary embodiments disclosed herein provide a basis for practicing the invention in a variety of ways on a wide selection of circuit structure designs. Such other constructions, although not expressly described herein, do not depart from the scope of the invention which is only limited by the claims which follow.

With regard to both the described embodiments and the claimed invention, multiple species of materials disclosed for practicing the invention are at times described or claimed generally as one material, e.g., silicon dioxide; and the various forms may be applied alone or in combination, e.g., in layers or discretely in separate portions of a circuit structure. While silicon dioxide is named as a material having a relatively high dielectric constant it should be understood that reference to applying silicon dioxide (or other material having a relatively high dielectric constant), means that application of various species of the material (having different densities and dielectric constants but all generally characterized by relatively high dielectric constants) is implied when consistent with acceptable practices for semiconductor manufacture. Reference to low k dielectric material and reference to material having relatively low dielectric constant distinguishes such material from other materials having relatively high dielectric constants; but does not limit the choice of materials described or claimed to one species or require that the resulting layers have identical dielectric properties wherever applied in a circuit structure. Thus, for example, generic reference to use of a dielectric material, having relatively low dielectric constant, in more than one portion of a structure does not mean that the identical dielectric material is used in those several portions, but rather, that the dielectric material present in all such portions is characterized by a relatively low dielectric constant.

We claim:

1. A semiconductor structure comprising:
   a first upper level of interconnect members formed over a semiconductor layer having an electronic device formed thereon;
   at least one lower level of interconnect members formed between the semiconductor layer and the first upper level;
   a first insulative material, having a relatively low dielectric constant positioned to electrically isolate members of the first upper level from one another and extending to the lower level of interconnect members; and
   a second insulative material, having a relatively high dielectric constant, positioned to electrically isolate members of the lower level from the electronic device.

2. The structure of claim 1 wherein a portion of the second insulative material extends between an interconnect member of the lower level and an interconnect member of the upper level.

3. The structure of claim 1 wherein the second insulative material predominantly comprises silicon dioxide and the structure further includes a plurality of individual portions formed of the second insulative material, each portion extending between a member of the lower level and a member of the upper level and self-aligned with said member of the upper level.

4. The structure of claim 1 including at least a second upper level of interconnect members formed over the first upper level.

5. The structure of claim 1 further including a plurality of dielectric supports, formed of the same composition as the second insulative material, each extending between one of the lower level interconnect members and one of the upper level interconnect members and providing physical support to sustain a spacial relationship between the lower level interconnect members and the upper level interconnect members.

6. The structure of claim 1 wherein members of the first level comprise Al, the first insulative material comprises hydrogen silsesquioxane and the second insulative material comprises silicon dioxide.

7. The structure of claim 1 further including a second upper level of interconnect members formed between the first upper level of interconnect members and the lower level of interconnect members wherein portions of the lower insulative material electrically isolate the second upper level of interconnect members from the lower level of interconnect members.

8. The structure of claim 1 further including:
   a plurality of additional upper levels of interconnect members formed between the first upper level and the lower level;
   a first layer formed of the first insulative material and positioned between the first upper level and a first of the additional levels; and
   a second layer formed of the first insulative material and positioned between second and third ones of the additional levels.

9. The structure of claim 1 comprising second, third, fourth and fifth upper levels of interconnect members formed between the first upper level and the lower level.

10. The structure of claim 9 wherein the first, second, third, fourth and fifth upper levels are electrically isolated from one another by a continuous layer comprising the first insulative material.

11. The structure of claim 9 wherein the first insulative material is a single species of low k dielectric material and the second insulative material predominantly comprises silicon dioxide.

12. The structure of claim 9 wherein multiple layers each comprising the first insulative material electrically isolate the first, second, third, fourth and fifth upper levels from one another.

13. The structure of claim 1 further including a second upper level of interconnect members formed between the first level of interconnect members and the lower level of interconnect members wherein portions of the second insulative material extend to electrically isolate the second upper level of interconnect members from the lower level of interconnect members.

14. The structure of claim 12 wherein portions of the second insulative material extend between two or more of the upper levels.

15. The structure of claim 1 further including:
   a first plurality of conductive portions extending at least between the upper level of interconnect and the lower level of interconnect; and
   a second plurality of conductive portions extending at least between the lower level of interconnect and some of the electronic devices.

16. The structure of claim 15 wherein the first plurality of conductive portions are integrally formed with members of the first upper level in a dual Damascene structure.

17. The structure of claim 15 wherein all of the members predominantly comprise Al.

18. The structure of claim 1 wherein the first insulative material extends from the first upper level to electrically isolate members of the lower level from one another.

19. The structure of claim 1 further including at least a second upper level of interconnect members formed over the first upper level of interconnect members with the first insulative material extending from the first upper level to electrically isolate members of the second upper level from one another.

20. A semiconductor structure comprising:
   a first upper level of interconnect members formed over a semiconductor layer;
   a lower level of interconnect members formed between the semiconductor layer and the first upper level; and
   insulative material positioned to electrically isolate portions of the upper level of interconnect members from one another, portions of the upper level of interconnect members from portions of the lower level of interconnect members and portions of the lower level of interconnect members from one another,
   said insulative material comprising a continuous layer extending from within regions between members of the upper level of interconnect to within regions between members of the lower level of interconnect, said continuous layer characterized by a dielectric constant less than 3.9.

21. The structure of claim 20 wherein the insulative material further includes portions extending between individual members of the upper level and individual members of the lower level, said portions formed of material having a dielectric constant greater than that of said continuous layer.

22. A method for forming a semiconductor structure, comprising:

depositing a first insulative layer over a semiconductor layer;

forming a lower level of interconnect members over the first insulative layer;

depositing a second insulative layer between and over the lower level of interconnect members;

forming all upper level of interconnect members over the second insulative layer removing portions of the second insulative layer positioned between interconnect members of the lower and upper levels; and forming a third insulative layer in regions from which the second insulative layer is removed.

23. The method of claim 22 wherein the second insulative layer comprises silicon dioxide and the third insulative layer has a relatively low dielectric constant relative to the second insulative layer.

24. The method of claim 22 further including the steps of:

forming an additional level of interconnect members over the lower level of interconnect members;

forming an additional insulative layer between and over members of said additional level; and replacing portions of the additional insulative layer with material having a low dielectric constant relative to silicon dioxide.

25. The method of claim 22 further including, forming a plurality of additional levels of interconnect members over the lower level of interconnect members;

positioning additional insulative material between and over each of said additional levels of interconnect members; and replacing portions of the additional insulative material with material having a low dielectric constant relative to silicon dioxide.

26. The method of claim 22 wherein the step of forming an upper level of interconnect members over the second insulative layer comprises formation of a dual Damascene structure.

27. A method for fabricating an integrated circuit structure comprising:

forming multiple levels of conductor lines over one another with some of the levels separated from one another by a layer of first insulative material;

then replacing portions of the first insulative material with a second insulative material having a dielectric constant lower than that of the first insulative material.

28. The method of claim 27 wherein the step of replacing portions of the first insulative material includes placing the second insulative material between conductor lines in at least one level.

29. The method of claim 28 wherein the step of replacing portions of the first insulative material comprises etching the first insulative material with one or more of the conductor lines masking other portions of the first insulative material thereby retaining said other portions in the integrated circuit structure.

30. The method of claim 29 wherein said other portions are self-aligned with masking conductor lines.

31. A method for fabricating an integrated circuit having interconnect members formed over a semiconductor surface, comprising:

providing a first insulator material between interconnect members;

then replacing portions of the first insulator material with a dielectric material having a lower dielectric constant than the first insulator material.

32. The method of claim 31 wherein the first insulator material comprises silicon dioxide and the dielectric material is hydrogen silsesquioxane.

33. The method of claim 31 wherein the step of replacing the first insulator material comprises etching the first insulator material.

* * * * *